(12) United States Patent
Lai et al.

(10) Patent No.: US 8,492,834 B2
(45) Date of Patent: Jul. 23, 2013

(54) ELECTROSTATIC DISCHARGE PROTECTION DEVICE AND APPLICATIONS THEREOF

(75) Inventors: Tai-Hsiang Lai, Hsinchu (TW); Lu-An Chen, Keelung (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 95 days.

(21) Appl. No.: 13/214,627

(22) Filed: Aug. 22, 2011

(65) Prior Publication Data

US 2013/0049112 A1    Feb. 28, 2013

(51) Int. Cl.
*H01L 29/66* (2006.01)
*H01L 23/62* (2006.01)

(52) U.S. Cl.
USPC .............. 257/337; 257/360; 257/E29.256; 257/E29.174

(58) Field of Classification Search
None
See application file for complete search history.

(56) References Cited

U.S. PATENT DOCUMENTS

| 6,788,507 | B2* | 9/2004 | Chen et al. ............... 361/56 |
| 6,909,149 | B2 | 6/2005 | Russ et al. |
| 7,205,612 | B2 | 4/2007 | Cai et al. |
| 7,672,100 | B2 | 3/2010 | Van Camp |
| 2003/0076636 | A1 | 4/2003 | Ker et al. |
| 2005/0285200 | A1* | 12/2005 | Kim ........................ 257/360 |
| 2011/0042716 | A1* | 2/2011 | Lai et al. ................. 257/140 |

* cited by examiner

*Primary Examiner* — W. Wendy Kuo
*Assistant Examiner* — Moazzam Hossain
(74) *Attorney, Agent, or Firm* — WPAT, PC; Justin King

(57) ABSTRACT

An electrostatic discharge protection device comprises a substrate with a first conductivity, a gate, a drain structure and a source structure. The gate is disposed on a surface of the substrate. The drain structure with a second conductivity type comprises a first doping region with a first doping concentration disposed adjacent to the gate and extending into the substrate from the surface of the substrate, a second doping region extending into and stooped at the first doping region from the surface of the substrate and having a second doping concentration substantially greater than the first doping concentration, and a third doping region disposed in the substrate beneath the second doping region and having a third doping concentration substantially greater than the first doping concentration. The source structure with the second conductivity is disposed in the substrate and adjacent to the gate electrode.

15 Claims, 6 Drawing Sheets

ELECTROSTATIC DISCHARGE PROTECTION DEVICE AND APPLICATIONS THEREOF

BACKGROUND OF THE INVENTION

1. Field of Invention

The present invention relates to a semiconductor device and the applications thereof, and more particularly relates to an electrostatic discharge (ESD) protection device and the applications thereof.

2. Description of Related Art

ESD is a transient process of high energy transformation from external to internal of an integrated circuit (IC) when the IC is floated. Several hundred or even several thousand volts are transferred during ESD stress. Such high voltage transformation will break down the gate oxide of an input stage and cause circuit error. As the thickness of gate oxide is scaled down constantly, it is more and more important that a protected circuit or device must be designed to protect the gate oxide and to discharge ESD stress.

One solution to the problem of ESD, a device for dispersing the ESD current into earth ground is integrated into the IC. For example, a gate ground n-type metal-oxide-semiconductor (GGNMOS) has been well known serves as an effective ESD protection device.

The GGNMOS is based on snapback mechanism. When the voltage reaches a level beyond the IC normal operation due to ESD zapping, the snapback mechanism enables the GGNMOS to conduct a high level ESD current between its drain and source and subsequently directs the ESD current into the earth ground. To increase the tolerance for ESD current, a GGNMOS with a great feature size is typically adopted. Furthermore, in order to conserve the IC layout region, the GGNMOS is designed as a multi-finger structure having a plurality of finger elementary transistors.

However, because each of the elementary transistors has different substrate resistance due to their different connection arrangements, the elementary transistors may not turn on uniformly triggered by the ESD stress. In other words, while the ESD zapping occurs, some elementary transistors may firstly turn on, and immediately breakdown with the onset of secondary snapback and the other elementary transistors may be inactive to contribute the ESD protection (which is referred as "latch up"). Accordingly, the ESD current can not be conducted into earth ground uniformly by all the finger elementary transistors, and the tolerance for ESD current of the GGNMOS cannot be scaled linearly with the device width. Therefore, how to enable each of the finger elementary transistors uniformly dispersing ESD current is still a challenge to the art.

SUMMARY OF THE INVENTION

According to one aspect of the present invention, an ESD protection device is provided, wherein the ESD protection device comprises a substrate with a first conductivity type, a gate, a drain structure and a source structure. The gate is disposed on a surface of the substrate. The drain structure with a second conductivity type comprises a first doping region, a second doping region, and a third doping region. The first doping region is disposed adjacent to the gate and extends into the substrate from the surface of the substrate. The second doping region extends into and stops at the first doping region from the surface of the substrate. The third doping region is disposed in the substrate beneath the second doping region. The first doping region has a first doping concentration, the second doping region has a second doping concentration substantially greater than the first doping concentration, and the third doping region has a third doping concentration substantially greater than the first doping concentration. The source structure with the second conductivity type is disposed in the substrate adjacent to the gate.

In one embodiment of the present invention, the ESD protection device is suitable for protecting a high voltage internal circuit, wherein the second doping concentration is substantially greater than the third doping concentration. In another embodiment of the present invention, the ESD protection device is suitable for protecting a low voltage internal circuit, wherein the second doping concentration is substantially less than or equal to the third doping concentration.

In one embodiment of the present invention, the ESD protection device is a double-diffused-drain metal-oxide-semiconductor field-effect-transistor (D-D-D MOS FET) or a Field-Drift MOSFET (F-D MOSFET).

In one embodiment of the present invention, the ESD protection device further comprises a first shallow trench isolator (STI) disposed in the first doping region used to isolate the second doping region from the gate.

In one embodiment of the present invention, the source structure comprises a fourth doping region with the first doping concentration extending into the substrate from the surface of the substrate adjacent to the gate, and a fifth doping region with the second doping concentration extending into the fourth doping region from the surface of the substrate.

In one embodiment of the present invention, the ESD protection device further comprises a second STI disposed in the fourth doping region used to isolate the fifth doping region from the gate.

In one embodiment of the present invention, the third doping region has a third lateral dimension with a direction perpendicular to the gate substantially less than a first lateral dimension of the first doping region and substantially greater than a second dimension of the second doping region.

According to another aspect of the present invention, an ESD protection circuit is to provide for protecting an internal circuit from an ESD stress, wherein the ESD protection circuit comprises an elementary MOS transistor electrically connected to the internal circuit. The elementary MOS transistor comprises a substrate with a first conductivity type, a gate, a source structure and a drain structure. The gate is disposed on a surface of the substrate. The drain structure having a second conductivity type comprises a first doping region with a first doping concentration disposed adjacent to the gate and extending into the substrate from the surface of the substrate, a second doping region extending into the first doping region from the surface of the substrate and having a second doping concentration substantially greater than the first doping concentration, and a third doping region disposed in the substrate beneath the second doping region and having a third doping concentration substantially greater than the first doping concentration. The source structure with the second conductivity type is disposed in the substrate adjacent to the gate electrode.

In one embodiment of the present invention, the internal circuit is a power supply circuit or an input/output (I/O) circuit.

In one embodiment of the present invention, the third doping concentration is substantially greater than the second doping concentration. In another embodiment of the present invention, the third doping concentration is substantially less than or equal to the second doping concentration.

In one embodiment of the present invention, the elementary MOS transistor is a D-D-D MOS FET or an F-D MOSFET.

In one embodiment of the present invention, the ESD protection circuit further comprises a first STI disposed in the first doping region used to isolate the second doping region from the gate.

In one embodiment of the present invention, the source structure comprises a fourth doping region with the first doping concentration extending into the substrate from the surface of the substrate adjacent to the gate, and a fifth doping region with the second doping concentration extending into the fourth doping region from the surface of the substrate.

In one embodiment of the present invention, the ESD protection circuit further comprises a second STI disposed in the fourth doping region used to isolate the fifth doping region from the gate.

In one embodiment of the present invention, the third doping region has a third lateral dimension with a direction perpendicular to the gate substantially less than a first lateral dimension of the first doping region and substantially greater than a second dimension of the second doping region.

In one embodiment of the present invention, the elementary MOS transistor is a GGNMOS FET, wherein the gate and the source structure are grounded and the drain structure is electrically connected to a VDD power line or a bonding pad.

In one embodiment of the present invention, the elementary MOS transistor is a gate-VDD p-type metal-oxide-semiconductor field-effect-transistor (GDPMOS FET), wherein the gate and the source structure are electrically connected to a VDD power line and the drain structure is electrically connected to a VSS power line or a bonding pad.

According to aforementioned embodiment of the present invention, an ESD protection device including an elementary MOS transistor is provided, wherein a doping region is formed under a drain drift region of the elementary MOS transistor, and the doping region has a conductivity type identical to that of the drain drift region, and the doping region has a doping concentration greater than that of the drain drift region, so as to prevent the secondary snapback happening. Thus only a snapback may occur on the elementary MOS transistor and the holding voltage of the elementary MOS transistor thereby can be remained on a level greater than its operation voltage during the ESD zapping event. Accordingly, "latch up" of the elementary MOS transistor can be avoided and tolerance for ESD current of elementary MOS transistor can be significantly increased and the capacity thereof can be scaled linearly with the device width. When this approach is applied to an ESD protection device having a multiple-finger structure, each of the elementary transistors of the ESD protection device can be uniformly turn on for dispersing ESD current. Therefore the aforementioned objects of the present invention are accomplished.

In order to make the aforementioned and other objects, features and advantages of the present invention comprehensible, preferred embodiments accompanied with figures are described in detail below.

BRIEF DESCRIPTION OF THE DRAWINGS

The above objects and advantages of the present invention will become more readily apparent to those ordinarily skilled in the art after reviewing the following detailed description and accompanying drawings, in which.

DESCRIPTION OF EMBODIMENTS

Figure 1A:
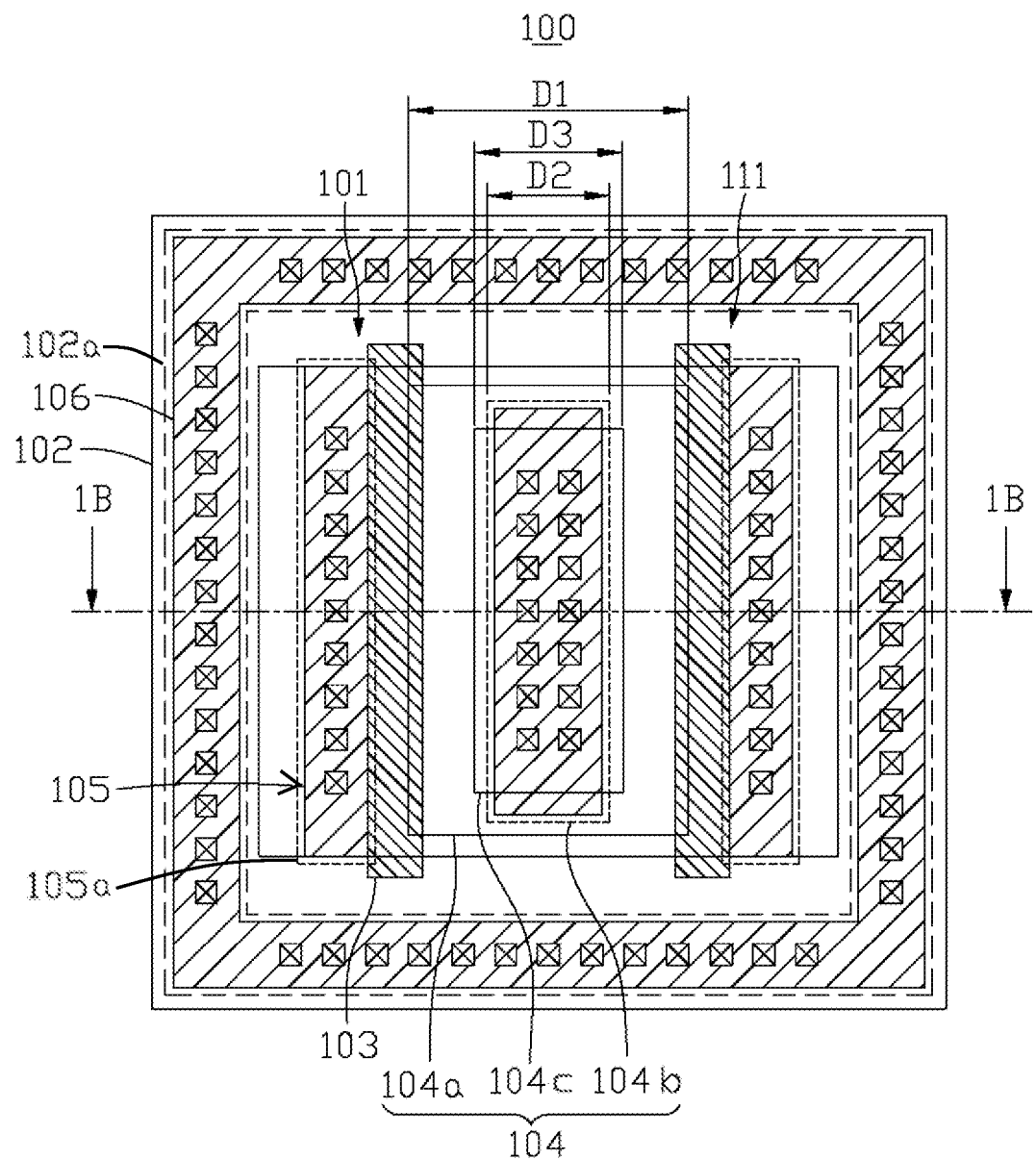
FIG. 1A is a plan view illustrating an ESD protection device in accordance with one embodiment of the present invention.

Detail descriptions of several embodiments eligible to exemplify the features of making and using the present invention, such as several ESD protection devices each including a D-D-D NMOS FET or an F-D NMOS FET, are disclosed as follows. However, it must be appreciated that the following embodiments are just exemplary, but not be used to limit the scope of the present invention. Wherever possible, the same reference numbers are used in the drawings and the description to refer to the same or like parts.

Figure 1B:
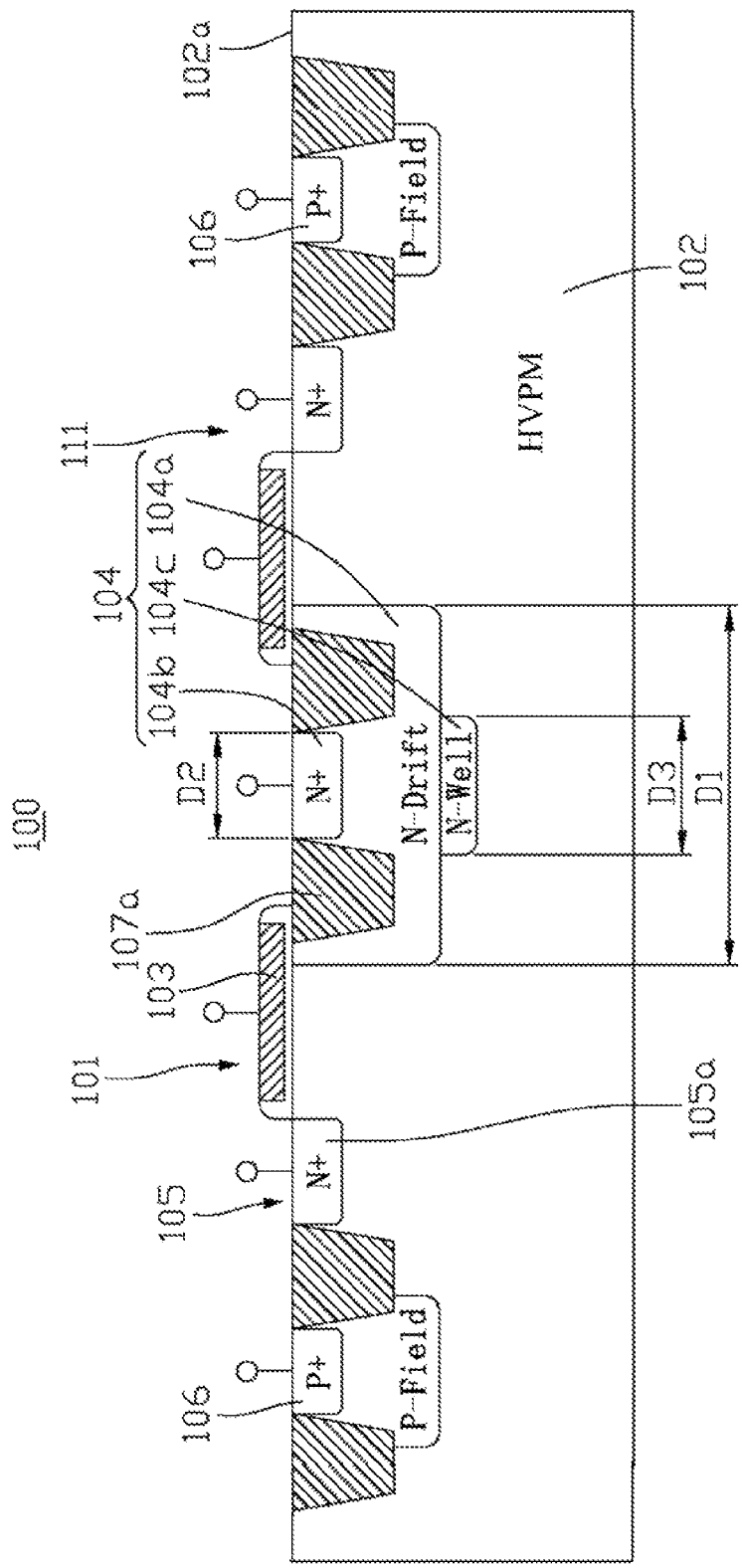
FIG. 1B is a cross sectional view of the ESD protection device illustrated along the section line 1B shown in FIG. 1A.

FIG. 1A is a plan view illustrating an ESD protection device 100 in accordance with one embodiment of the present invention. FIG. 1B is a cross sectional view of the ESD protection device 100 illustrated along the section line 1B shown in FIG. 1A.

As shown in FIG. 1A, the ESD protection device 100 is a multi-finger structure having a plurality of finger elementary MOS transistors and surrounded by a guard ring 106. For example, in the present embodiment, the ESD protection device 100 comprises a plurality of finger GGNMOS FETs 101 and 111. However, in other embodiments of the present invention, the ESD protection device 100 may otherwise comprise a plurality of finger GDPMOS FETs.

As shown in FIG. 1B, each of the GGNMOS FETs, such as the GGNMOS FETs 101 or 111 (for clearly description, the GGNMOS FET 101 is selected to exemplify the other identical MOS transistors thereinafter) comprise a substrate 102, a gate 103, a drain structure 104 and a source structure 105. In the present embodiment, the substrate 102 is a p-type substrate having a high voltage p-well (referred as HVPW). The gate 103 is disposed on a surface 102a of the substrate 102. The drain structure 104 comprises a first doping region 104a, a second doping region 104b and a third doping region 104c, and three of them are doped with n-type dopants.

The first doping region 104a is disposed in the substrate 102 adjacent to the gate 103, extends downwards from the surface 102a of the substrate 102 and has a first doping concentration of the n-type ion dopants (referred as N-Drift). The second doping region 104b extends downward into and stops at the first doping region 104a from the surface 102a of the substrate 102 and has a second doping concentration of the n-type ion dopants (referred as N+) substantially greater than the first doping concentration N-Drift. The third doping region 104c is disposed in the substrate 102 beneath the first doping region 104a and has a third doping concentration of the n-type ion dopants (referred as N-Well) greater than the first doping concentration N-Drift.

In some embodiments of the present invention, the second doping concentration N+ is substantially greater than the third doping concentration N-Well, such that the ESD protection device 100 is suitable for protecting a high voltage internal circuit. In some other embodiments of the present invention, the second doping concentration is substantially less than or equal to the third doping concentration, such that the ESD protection device 100 is suitable for protecting a low voltage internal circuit. In addition, the third doping region 104c has a third lateral dimension D3 with a direction perpendicular to the gate 103 substantially less than a first lateral dimension D1 of the first doping region 104a and substantially greater than a second dimension D2 of the second doping region 104b.

The source structure 105 also comprises an n-type doping region 105a adjacent to the gate 103. The n-type doping region 105a extends into the substrate 102 from the surface 102a and has a doping concentration identical to the second doping concentration N+. The guard ring 106 consists of a P-Field region and a p+ region with a doping concentration greater than that of the P-Field region. Besides, the NMOS FET 101 further comprises a first STI 107a disposed in the first doping region 104a used to isolate the second doping region 104b from the gate 103.

It should be appreciated that, although the GGNMOS FETs 101 shown in FIG. 1B is depicted as an asymmetric F-D NMOS FET, however, in some other embodiments the GGNMOS FETs 101 can be replaced by a symmetric F-D NMOS FET.

Figure 2:
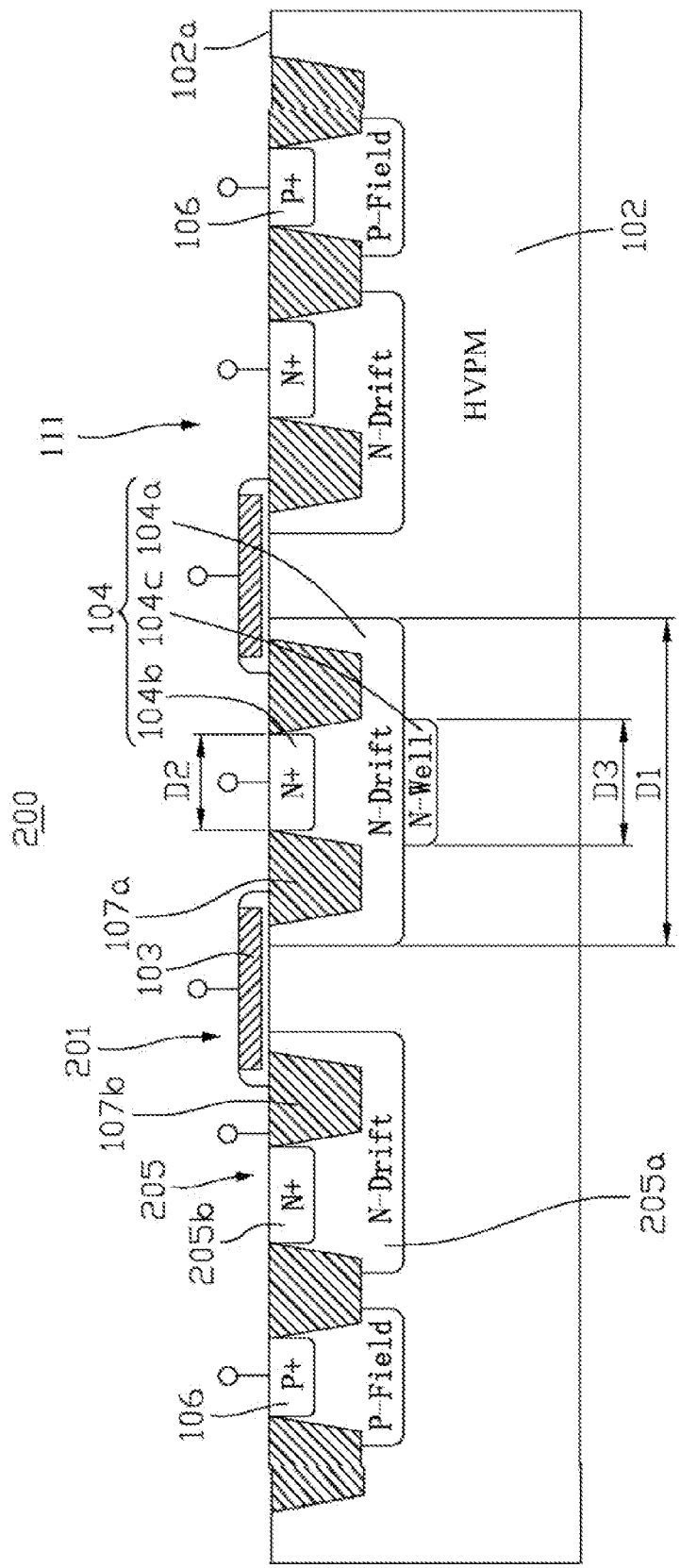
FIG. 2 is a cross sectional view illustrating an ESD protection device comprising a symmetric F-D NMOS FET in accordance with another embodiment of the present invention.

FIG. 2 is a cross sectional view illustrating an ESD protection device 200 comprising a symmetric F-D NMOS FET 201 in accordance with another embodiment of the present invention. The structure of the ESD protection device 200 is substantially similar to that of the ESD protection device 100 shown in FIG. 1B, the major difference between these two ESD protection devices 100 and 200 is that the source structure 205 of the symmetric F-D NMOS FET 201 (not including the second doping region 104b) is symmetric to its drain structure 104, but the source structure of the asymmetric F-D NMOS FET (the GGNMOS FET 101) shown in FIG. 1B is not.

In the present embodiment, the source structure 205 of the symmetric F-D NMOS FET 201 comprises a n-type fourth doping region 205a with a doping concentration identical to the first doping concentration N-Drift and a fifth doping region 205b with a doping concentration identical to the second doping concentration N+. The fourth doping region 205a is disposed in the substrate 102 adjacent to the gate 103 and extends from the surface 102a of the substrate 102. The fifth doping region 205b extends into the fourth doping region 205a from the surface 102a of the substrate 102. Similar to the drain structure 104, a second STI 107b is formed in the fourth doping region 205a used to isolate the fifth doping region 205b from the gate 103.

Figure 3:
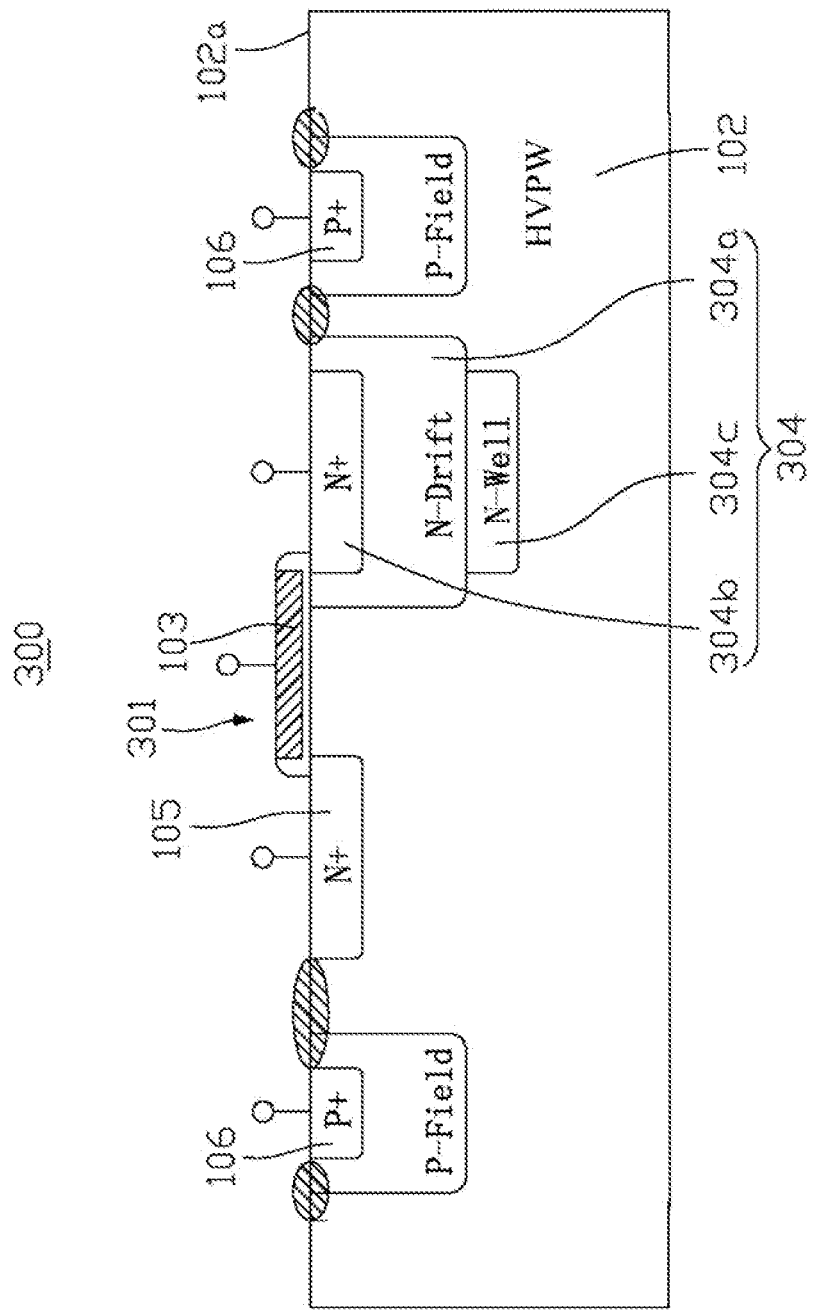
FIG. 3 is a cross sectional view illustrating an ESD protection device comprising an asymmetric D-D-D NMOS FET in accordance with a third embodiment of the present invention.

Besides, in some other embodiment, the F-D NMOS FET (the GGNMOS FET 101) shown in FIG. 1B can also be replaced by a symmetric D-D-D NMOS FET or an asymmetric D-D-D NMOS FET. FIG. 3 is a cross sectional view illustrating an ESD protection device 300 comprising an asymmetric D-D-D NMOS FET 301 in accordance with a third embodiment of the present invention. The structures of the ESD protection device 300 and the ESD protection device 100 are substantially the same, except the difference between the drain structure 305 of the asymmetric D-D-D NMOS FET 301 and the drain structure 105 of the GGNMOS FET 101.

Like the drain structure 105 of the GGNMOS FET 101 (as shown in FIG. 1B), the drain structure 304 of the asymmetric D-D-D NMOS FET 301 also comprises a first doping region 304a, a second doping region 304b and a third doping region 304c. Besides the size and the doping concentrations of the first doping region 304a, the second doping region 304b and the third doping region 304c are substantially the same with the first doping region 104a, the second doping region 104b and the third doping region 104c of the GGNMOS FET 101. However, the asymmetric D-D-D NMOS FET 301 doses not have any STI used to isolate the second doping region 304b and the gate 103.

Figure 4:
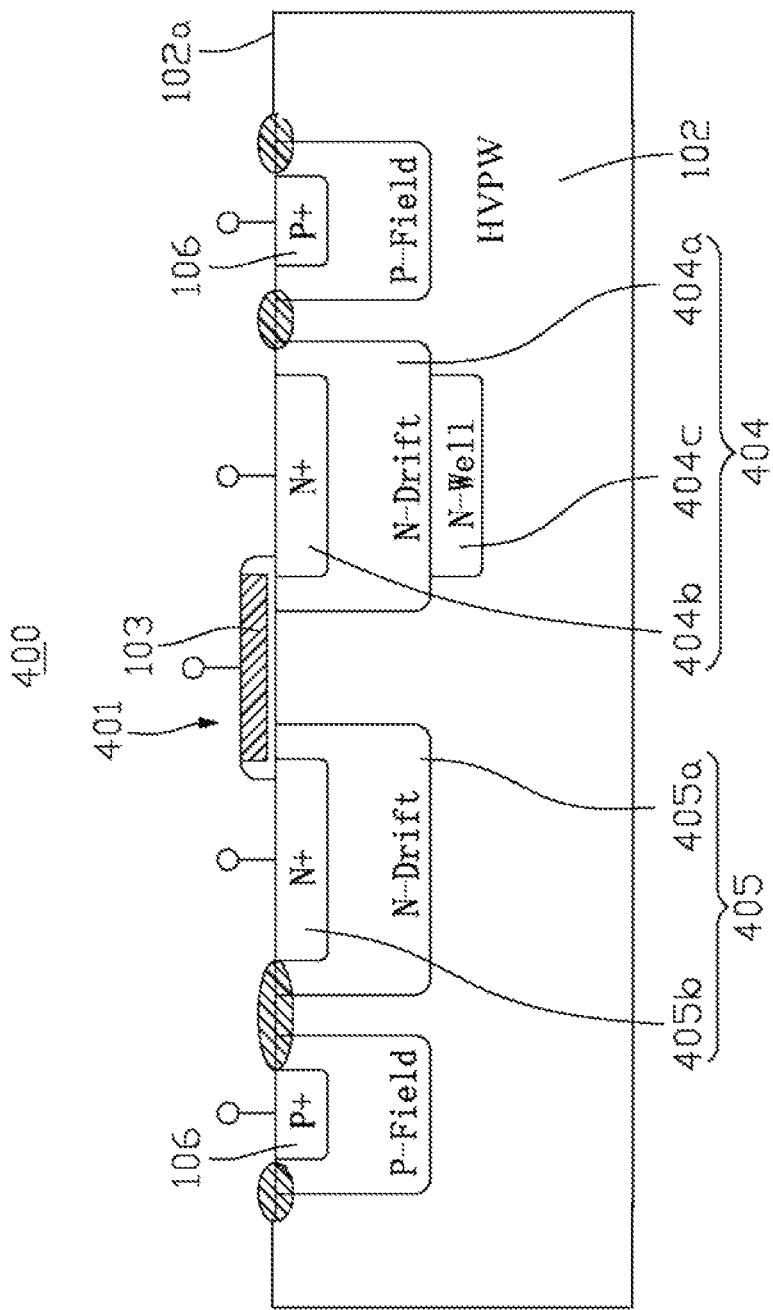
FIG. 4 is a cross sectional view illustrating an ESD protection device comprising a symmetric D-D-D NMOS FET in accordance with a third embodiment of the present invention.

Similarly a symmetric D-D-D NMOS FET 401 having a drain structure 404 comprising of a first doping region 404a, a second doping region 404b and a third doping region 404c and a source structure composing of a fourth doping region 405a and a fifth doping region 405b can also take the place of the GGNMOS FET 101 to form an ESD protection device 400 as shown in FIG. 4.

In comparison with a contrary approach which utilizes a GGNMOS FET as a ESD protection device, because the drain structure of a traditional GGNMOS FET merely includes an N-Drift region formed in a HVPW substrate and an N+ region with a doping concentration greater than that of the N-Drift region disposed in the N-Drift region. During an ESD zapping event a first snapback may firstly occur at the HVPW/N-Drift junction, and a secondary snapback may immediately occur at the N+/N-Drift junction due to the base push out effect, the holding voltage of the GGNMOS FET thereby may be remained on a level lower than its operation voltage. Thus the ESD protection device is latched up by a permanent damage of the GGNMOS FET.

Regarding to the ESD protection device 100, 200, 300 and 400 provided by the aforementioned embodiments, an additional N-Well region with a doping concentration greater than that of the N-Drift region is formed in the HVPW substrate beneath the N-Drift region, whereby the location where the first snapback occurs may be transferred to the N-Well/HVPW junction. In addition, because the N-Well region is formed under the N-Drift region, the formation of the N-Well region may increase the doping concentration of the N-Drift region and terminate the concentration difference between the N-Drift region and the N+ region, such that the second snapback may not occur and the location where the first snapback occurs may be remained at the N-Well/HVPW junction rather than transferred to the N+/N-Drift junction. In addition, since the junction depth of the first snapback and the channel resistance are increased due to the formation of the N-Well may increase, thus the holding voltage of the present elementary MOS transistor composing of the ESD protection device 100, 200, 300 and 400 can be remained on a level higher than its operation voltage. Therefore the tolerance for the ESD of the elementary MOS transistor can be significantly increased and can be scaled linearly with the device width.

Figure 5:
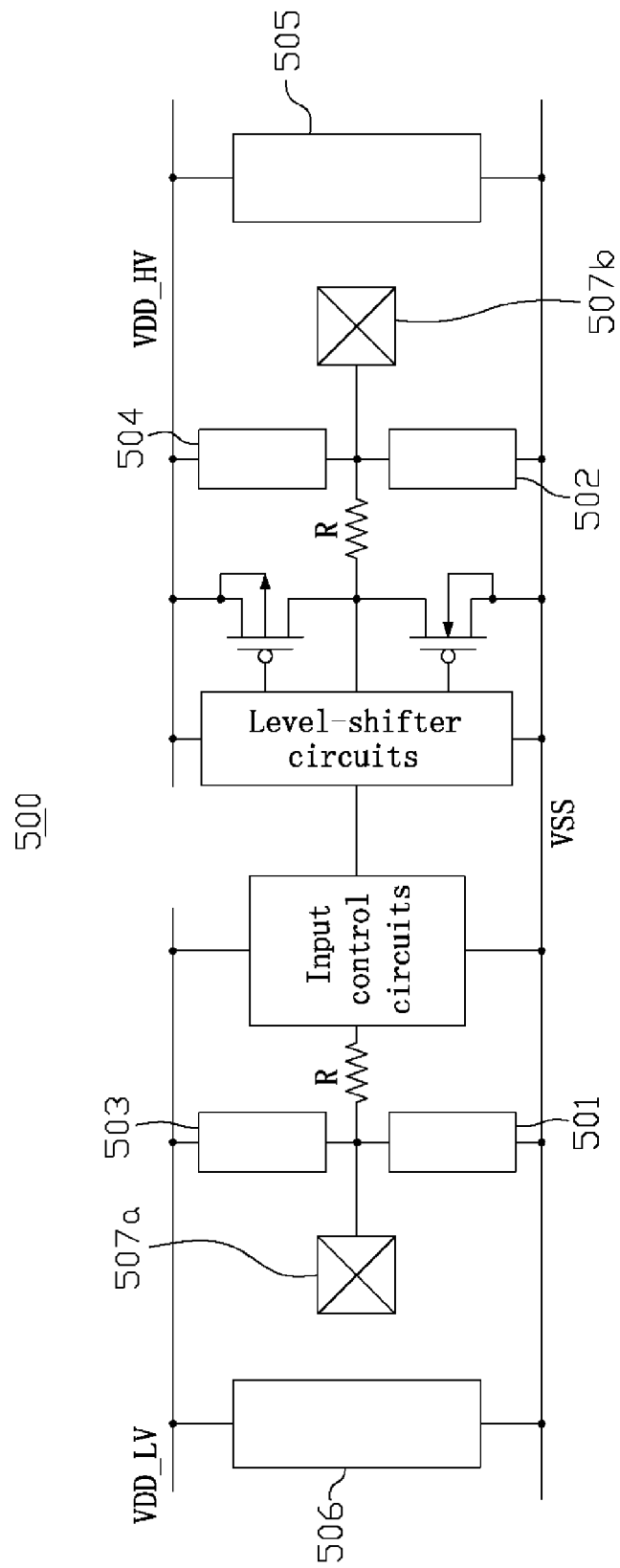
FIG. 5 illustrates an ESD protection circuit in accordance with one preferred embodiment of the present invention, used for protecting a liquid crystal displayer (LCD) diver IC from damage due to ESD stress.

The ESD protection device 100, 200, 300 and 400 provide by the aforementioned embodiments may be incorporated into an internal circuit, such as a power supply circuit or an I/O circuit, to protect the internal circuit from the damage due to ESD stress. FIG. 5 illustrates an ESD protection circuit 500 in accordance with one preferred embodiment of the present invention, used for protecting a liquid crystal displayer (LCD) diver IC from damage due to ESD stress.

In the present embodiment, the ESD protection circuit 500 comprises a plurality of ESD clamps 501, 502, 503 and 504, wherein the ESD clamps 501 and 502 are mainly composed of the GGNMOS FETs 101, and the ESD clamps 501 and 502 mainly composed of GDPMOS FETs.

The gates and sources of these GGNMOS FETs incorporated in the ESD clamps 501 and 502 are electrically connected to a grounded VSS power line, and the drains of these GGNMOS FETs 101 are respectively connected to a boding pad or terminal 507a and 507b of a I/O circuit composing the LCD diver IC. The gates and sources of these GDPMOS FETs incorporated in the ESD clamps 503 and 504 are electrically connected to a VDD_LV power line and a VDD_HV power line, respectively. The VDD_HV power line has higher voltage than the VDD_LV power line. The drains of these GDPMOS FETs are respectively connected to a boding pad or terminal 507a and 507b of the I/O circuit.

At normal condition, the ESD clamps 501, 502, 503 and 504 are inactive without interfering the I/O circuit and while the ESD zapping occurs at the boding pad 507a and 507b of the I/O circuit, the ESD clamps 501, 502, 503 and 504 can be triggered to turn on for dispersing the ESD current into earth ground.

Similarly the ESD clamps 505 and 506 can be connected between the VSS power line and the VDD_HV/VDD_LV power line to protect a high voltage power supply circuit or a low voltage power supply circuit of the LCD diver IC from the damage of ESD stress.

According to aforementioned embodiment of the present invention, an ESD protection device including an elementary MOS transistor is provided, wherein a doping region is formed under a drain drift region of the elementary MOS transistor, and the doping region has a conductivity type identical to that of the drain drift region, and the doping region has a doping concentration greater than that of the drain drift region, so as to prevent the secondary snapback happening. Thus only a snapback may occur on the elementary MOS transistor, the holding voltage of the elementary MOS transistor thereby can be remained on a level greater than its operation voltage during the ESD zapping event. Accordingly, "latch up" of the elementary MOS transistor can be avoided and tolerance for ESD current of elementary MOS transistor can be significantly increased and the capacity thereof can be scaled linearly with the device width. When this approach is applied to an ESD protection device having a multiple-finger structure, each of the elementary transistors of the ESD protection device can be uniformly turn on for dispersing ESD current. Therefore the aforementioned objects of the present invention are accomplished.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An electrostatic discharge (ESD) protection device comprising:
    a substrate, with a first conductivity type;
    a gate, disposed on a surface of the substrate;
    a drain structure having a second conductivity type and comprising:
    a first doping region with a first doping concentration, disposed adjacent to the gate and extending into the substrate from the surface of the substrate;
    a second doping region, extending into and stopped at the first doping region from the surface of the substrate and having a second doping concentration substantially greater than the first doping concentration; and
    a third doping region, disposed in the substrate beneath the second doping region and having a third doping concentration substantially greater than the first doping concentration, the second doping concentration is substantially less than or equal to the third doping concentration; and
    a source structure having the second conductivity type and disposed in the substrate adjacent to the gate.

2. The ESD protection device of claim 1, further comprising a first shallow trench isolator (STI) disposed in the first doping region used to isolate the second doping region from the gate.

3. The ESD protection device of claim 1, is a double-diffused-drain metal-oxide-semiconductor field-effect-transistor (D-D-D MOSFET) or a Field-Drift metal-oxide-semiconductor field-effect-transistor (F-D MOSFET).

4. The ESD protection device of claim 1, wherein the source structure comprises:
    a fourth doping region with the first doping concentration, disposed adjacent to the gate and extending into the substrate from the surface of the substrate; and
    a fifth doping region with the second doping concentration, extending into the fourth doping region from the surface of the substrate.

5. The ESD protection device of claim 4, further comprising a second STI disposed in the fourth doping region used to isolate the fifth doping region from the gate.

6. The ESD protection device of claim 1, wherein the third doping region has a third lateral dimension with a direction perpendicular to the gate substantially less than a first lateral dimension of the first doping region and substantially greater than a second dimension of the second doping region.

7. An ESD protection circuit for protecting an internal IC from an ESD stress, comprising:
    an elementary metal-oxide-semiconductor (MOS) transistor electrically connected to the internal circuit comprising:
    a substrate with a first conductivity type;
    a gate, disposed on a surface of the substrate;
    a drain structure having a second conductivity type and comprising:
    a first doping region, disposed adjacent to the gate and extending into the substrate from the surface of the substrate with a first doping concentration;
    a second doping region, extending into the first doping region from the surface of the substrate with a second doping concentration substantially greater than the first doping concentration; and
    a third doping region, disposed in the substrate and beneath the second doping region with a third doping concentration substantially greater than the first doping concentration, the second doping concentration is substantially less than or equal to the third doping concentration; and
    a source structure having the second conductivity type and disposed in the substrate adjacent to the gate.

8. The ESD protection circuit of claim 7, wherein the internal circuit is a power supply circuit or an input/output (I/O) circuit.

9. The ESD protection circuit of claim 7, further comprising a first STI disposed in the first doping region used to isolate the second doping region from the gate.

10. The ESD protection circuit of claim 7, wherein the elementary MOS transistor is a D-D-D MOS FET or an F-D MOSFET.

11. The ESD protection circuit of claim 7, wherein the source structure comprises:
    a fourth doping region, disposed adjacent to the gate and extending into the substrate from the surface of the substrate with the first doping concentration; and
    a fifth doping region, extending into the fourth doping region from the surface of the substrate with the second doping concentration.

12. The ESD protection circuit of claim 11, further comprising a second STI disposed in the fourth doping region used to isolate the fifth doping region from the gate.

13. The ESD protection circuit of claim 7, wherein the third doping region has a third lateral dimension with a direction perpendicular to the gate substantially less than a first lateral dimension of the first doping region and substantially greater than a second dimension of the second doping region.

14. The ESD protection circuit of claim 7, wherein the elementary MOS transistor is a GGNMOS FET, the gate and the source structure are grounded and the drain structure is electrically connected to a VDD power line or a bonding pad.

15. The ESD protection circuit of claim 7, wherein the elementary MOS transistor is a gate-VDD p-type metal-oxide-semiconductor field-effect-transistor (GDPMOS FET), the gate and the source structure are electrically connected to a VDD power line and the drain structure is electrically connected to a VSS power line or a bonding pad.

* * * * *